(12) United States Patent
Mermet-Guyennet

(10) Patent No.: US 6,278,179 B1
(45) Date of Patent: Aug. 21, 2001

(54) POWER ELECTRONIC DEVICE

(75) Inventor: Michel Mermet-Guyennet, Aurensan (FR)

(73) Assignee: Alstom Holdings, Paris (FR)

( * ) Notice: Subject to any disclaimer, the term of this patent is extended or adjusted under 35 U.S.C. 154(b) by 0 days.

(21) Appl. No.: 09/444,998

(22) Filed: Nov. 23, 1999

(30) Foreign Application Priority Data

Nov. 27, 1998 (FR) .................................................. 98 15157

(51) Int. Cl.[7] .......................... H01L 23/02; H01L 23/34; H01L 23/48; H01L 23/52; H01L 23/40
(52) U.S. Cl. .......................... 257/686; 257/723; 257/712; 257/778
(58) Field of Search .................................. 257/686, 723, 257/712, 778

(56) References Cited

U.S. PATENT DOCUMENTS 5,019,946 * 5/1991 Eichelberger et al. .

5,532,512 7/1996 Fillion et al. .

FOREIGN PATENT DOCUMENTS 44 03 996 A1 8/1995 (DE) .

\* cited by examiner

Primary Examiner—David E. Graybill
(74) Attorney, Agent, or Firm—Sughrue, Mion, Zinn, Macpeak & Seas, PLLC

(57) ABSTRACT

The device comprises a conductive substrate on which rests a first plane arrangement of semiconductor circuits formed by diodes and IGBT having connecting terminals. The device comprises at least one second plane arrangement of semiconductor circuits, two adjacent plane arrangements being separated by a plane conductor array comprising at least one electrically conductive and heat dissipative busbar connected to terminals of circuits of a first arrangement, said busbar further supporting circuits of a second plane arrangement, at least one conductive member electrically insulated from said busbar being connected to other terminals of the circuits of said first arrangement and being disposed within the volume of said busbar.

10 Claims, 3 Drawing Sheets

POWER ELECTRONIC DEVICE

BACKGROUND OF THE INVENTION

Electronic power devices particularly intended for rail traction usually comprise a conductive substrate made of copper, for example, to which are attached composite conductor-insulator-conductor structures having a heat transfer and electrical insulation function. The conductive top layer of each composite structure constitutes a substrate on which diodes and insulated gate bipolar transistors (IGBT) are disposed in an arrangement that varies with the nature of the electronic device concerned. The power semiconductor circuits are fixed by tin-lead or tin-lead-silver soft solder.

The free faces of the diodes and the IGBT are covered by one or more connecting terminals to each of which are soldered aluminum wires which typically have a diameter in the order of 380 to 500 microns. The other end of each wire is soldered to the top conductive substrate of one of the composite structures forming an inverter arm.

The above design, which is well-known in the art, has some drawbacks, however. The above power electronic devices are complex to manufacture because they include a very large number of aluminum wires. Also, the overall surface area of these power devices is relatively large, which increases the overall volume of the assembled device and also causes spurious inductance phenomena which compromise its electrical operation.

OBJECT AND SUMMARY OF THE INVENTION

The object of the invention is to provide an electronic power device which can alleviate the drawbacks of the prior art referred to above. To this end, it consists in a power electronic device comprising a conductive substrate on which rests a first plane arrangement of semiconductor circuits formed by diodes and insulated gate bipolar transistors, said semiconductor circuits having connecting terminals, wherein said device comprises at least one second plane arrangement of semiconductor circuits, two adjacent plane arrangements being separated by a plane conductor array comprising at least one electrically conductive and heat dissipative busbar connected to terminals of circuits of a first arrangement, said busbar further supporting, on its face opposite the substrate, circuits of a second plane arrangement, at least one conductive member electrically insulated from said busbar being connected to other terminals of the circuits of said first arrangement and being disposed within the volume of said busbar.

According to other features of the invention:

- an end plane arrangement of semiconductor circuits is covered by an end plane conductor array which comprises at least one electrically conductive and thermally dissipative end busbar connecting terminals of the circuits of said end arrangement and at least one end conductor member electrically insulated from said end busbar which is connected to other terminals of circuits of said end arrangement and is within the volume of the busbar;
- the terminals of said plane arrangements are fixed to the respective plane arrays by soldering at least one tin-lead-silver boss;
- said terminals are separated from the boss or each boss by a coating adhering to the boss or to each boss, in particular a titanium-nickel-gold deposit;
- said at least one conductive busbar has at least one shoulder and thereby extends globally in a plane parallel to that of said substrate;
- said substrate and said end busbar are parts of respective thermal transfer and electrical insulation composite structures;
- said conductive busbar has notches receiving said conductive members;
- the device forms an inverter arm and comprises identical first and second plane arrangements and first and second plane conductor arrays;
- each of said plane arrays 38B) comprises at least one gate common to a row of insulated gate bipolar transistors in series;
- said conductive busbars of said first plane array and said second plane array form emitters common to the insulated gate bipolar transistors of said first plane arrangement and said second plane arrangement, respectively.

BRIEF DESCRIPTION OF THE DRAWINGS

The invention is described below with reference to the accompanying drawings, which are given by way of non-limiting example only, and in which.

MORE DETAILED DESCRIPTION

Figure 1:
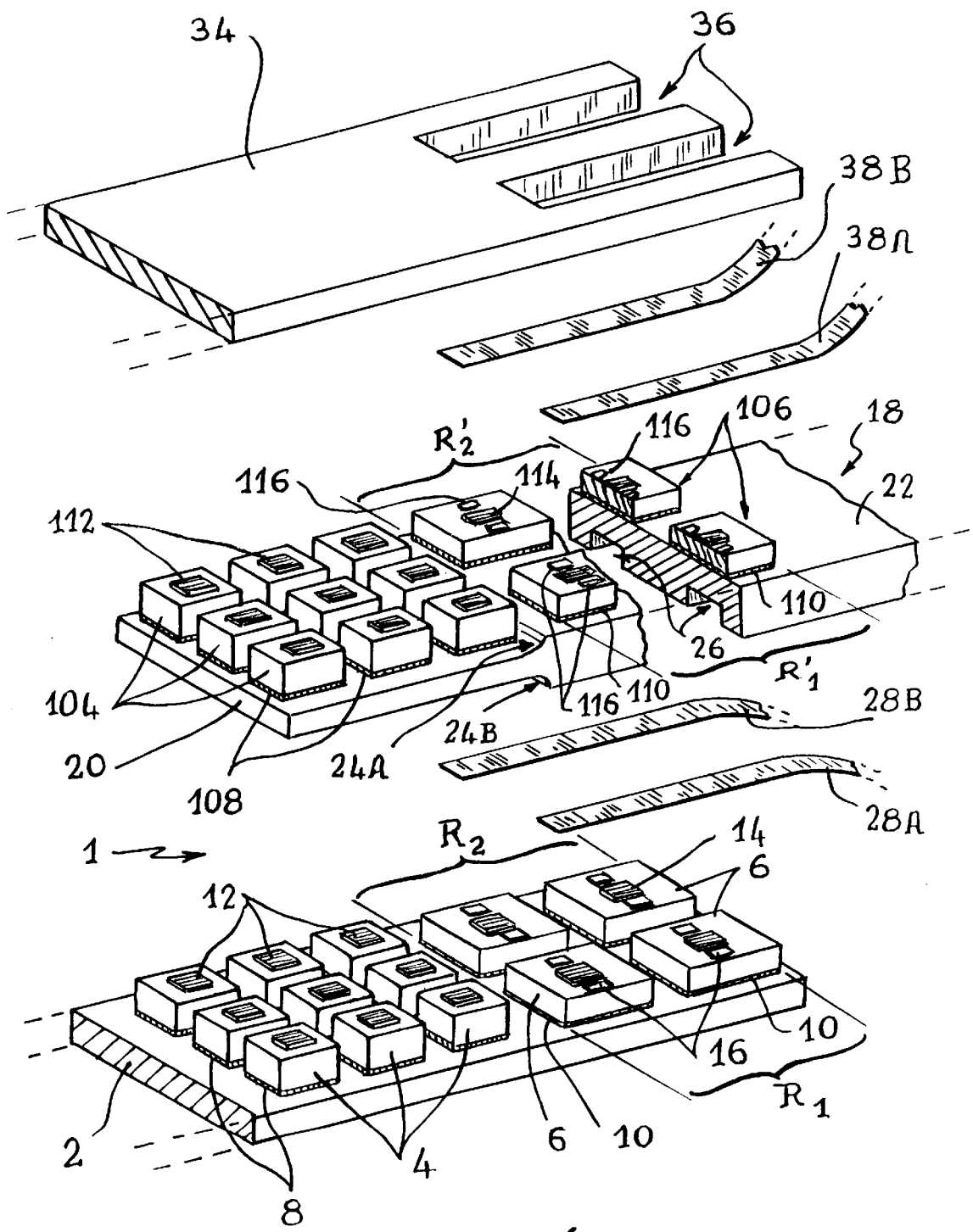
FIG. 1 is a cutaway perspective view showing the component parts of an inverter arm in accordance with the invention.

Figure shows the manufacture of an inverter arm 1 in accordance with the invention. Diodes 4 and IGBT 6 forming a first plane semiconductor circuit arrangement are placed on a bottom substrate 2 made of copper, for example. The diodes 4 and the IGBT 6 are fixed to the substrate 2 by respective layers of tin-lead solder 8 and 10, in a manner that is well-known in the art. Each diode 4 is conventionally provided with a single connecting terminal 12 and each IGBT comprises a central terminal 14 and a plurality of peripheral terminals 16. In the example shown, the substrate supports nine diodes and four IGBT, but the skilled person can select a different number of circuits according to the required characteristics of the finished inverter arm.

An electrically conductive busbar 18 rests on the free face of the terminals 12, 14, 16 of the semi-conductor circuits 4, 6. The busbar 18 has a thinner end part 20 and a thicker main part 22 separated by top and bottom shoulders 24A and 24B, respectively. The dimensions of the top shoulder 24A are such that the busbar 18 rests on the circuits 4, 6 in a plane substantially parallel to that of the substrate 2.

Diodes 104 and IGBT 106 are placed on the top face of the thinner part 20 and the main part 22 to constitute a second arrangement of semiconductor circuits identical to the first arrangement described above. The diodes 104 and the IGBT 106 are fixed by means of respective solder layers 108, 110. The diodes have a single terminal 112 and the IGBT have a central terminal 114 and lateral terminals 116. The dimensions of the top shoulder 24A are such that the top faces of the terminals 112, 114, 116 are substantially in a common plane parallel to that of the substrate 2.

Figure 3:
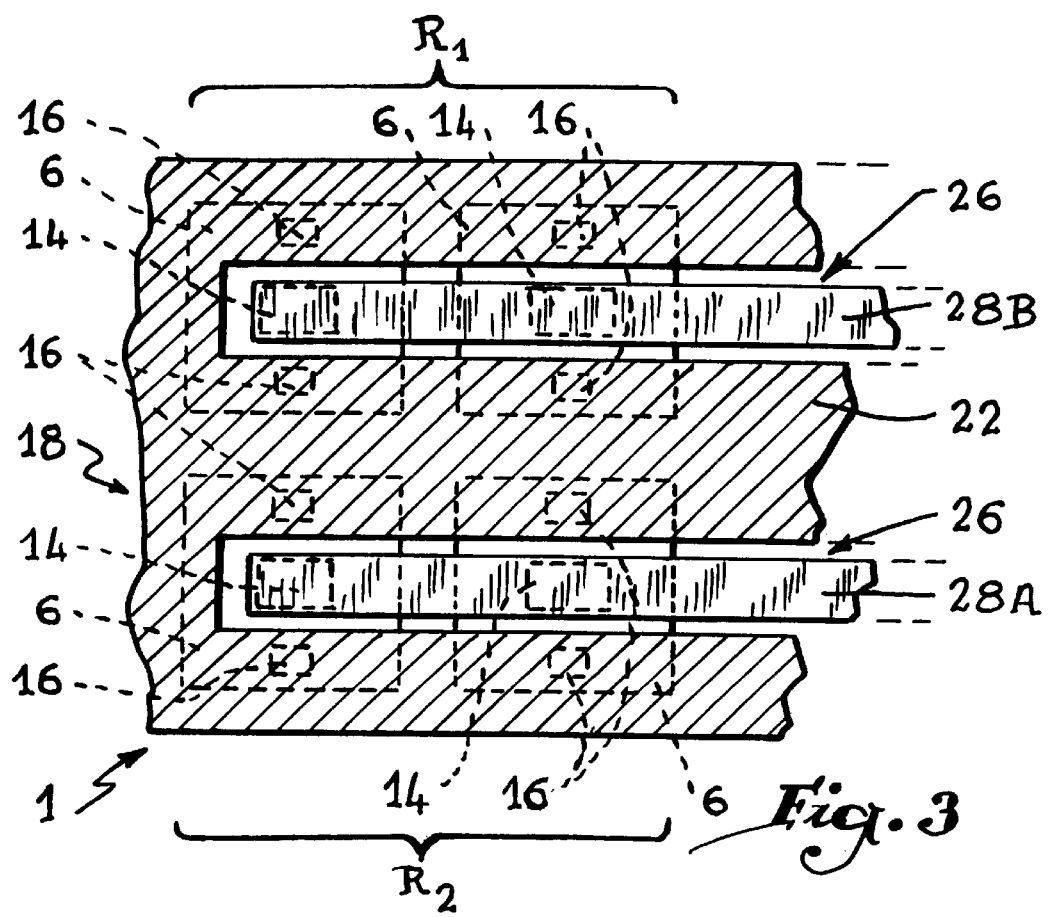
FIG. 3 is a partial view in section taken along the line III—III in FIG. 2.

Two notches 26 are formed on the lower face of the main part 22 of the busbar 18. The notches 26 receive two conductive members in the form of electrically interconnected rods 28A and 28B. The first rod 28A covers the center terminals 114 of a first row (R$_1$) of IGBT disposed in series and the second rod 28B covers the center terminals of the second row (R$_2$) of IGBT, as shown in FIG. 3. The rods 28A, 28B then constitute two gates connecting the two rows (R$_1$, R$_2$) of IGBT in parallel.

When the inverter arm has been assembled, the edges of the notches 26 in the busbar 18 rest on the lateral terminals 16 of each IGBT 6. The busbar 18 therefore constitutes a common emitter for all of the IGBT. Note that the respective dimensions of the notches 26 and the rods 28 are such that the latter are electrically insulated from the busbar 18. The rods 28 and the bottom face of the busbar 18 therefore form a plane array of mutually insulated conductive members.

Figure 4:
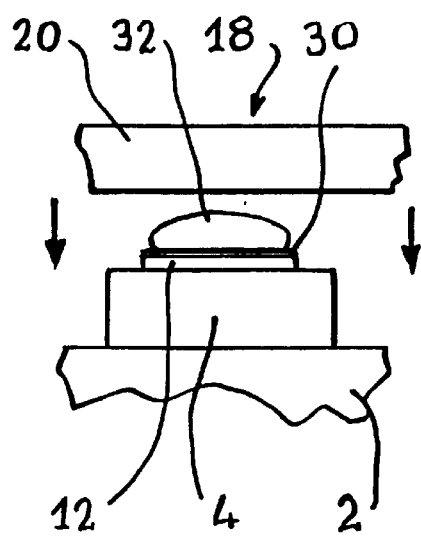
FIG. 4 is a diagram showing the fixing of a conductive busbar to a diode of the inverter arm of the invention.

How the thinner part 20 of the busbar 18 is fixed to a diode 4 supported by the substrate 2 will now be described with reference to FIG. 4.

The first step is to deposit a multilayer titanium-nickel-gold coating 30 approximately 0.8 micrometers thick on the free face of the terminal 12 of the diode 4 by means of a spray process, for example.

A tin-lead-silver boss 32 whose size corresponds to that of the terminal 12 is then placed on the multilayer coating 30. In this example, the boss contains approximately 2% tin, 95.5% lead and 2.5% silver. Note that the multilayer coating 30 achieves excellent mechanical fixing of the boss 32 to the terminal 12.

The next step is to bring the bottom face of the thinner part 20 of the busbar 18 into contact with each boss 32 and to melt each boss by heating it to approximately 330° C. for 10 seconds, for example. This fixes the terminal 12 to the busbar 18.

The example described and shown refers only to fixing the thinner part 20 of the busbar 18 to a terminal 12 of a diode 4. Of course, the main part 22 of the busbar 18 is fixed to the lateral terminal 16 of the IGBT 6 and the rods 28A and 28B are fixed to the center terminals 14 of the IGBT 6 using similar processes.

The last step in the manufacture of the inverter arm 1 is to attach an additional conductive busbar 34 over the conductive circuits 104, 106 supported by the busbar 18 at the end opposite the substrate 2. The busbar 34 has notches 36 which receive conductive rods 38A and 38B analogous to the rods 28A and 28B described previously. The rods 38A and 38B, which are electrically interconnected, constitute additional conductive elements on the side opposite the substrate 2.

In a manner similar to that described above with reference to the circuits 4 and 6, the additional conductive busbar 34 covers all of the terminals 112 of the diodes 104 and the peripheral terminals 116 of the IGBT 106 once the inverter arm has been assembled. The busbar 34 therefore constitutes a common emitter for all the IGBT. Moreover, the first additional rod 38A covers the center terminals 114 of a first row (R'$_1$) of IGBT and the second additional rod 38B is disposed over the center terminals of the second row (R'$_2$) of IGBT, with the result that each rod constitutes a gate common to the IGBT of the same row. Note that the respective dimensions of the notches 36 and the rods 38 are such that the busbar 34 and the rods 38 are not in mutual contact and constitute a plane array of mutually insulated conductive members.

Figure 2:
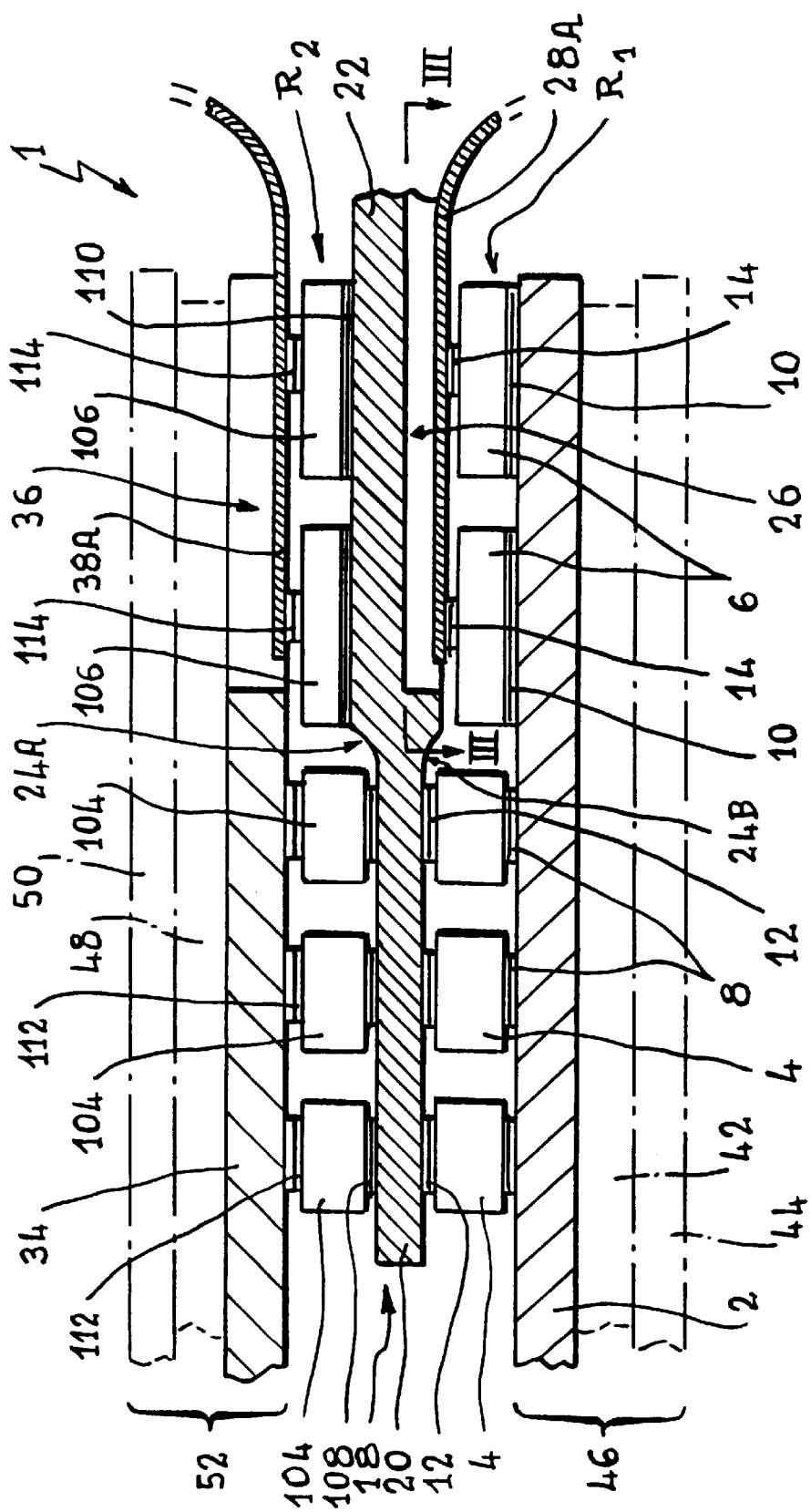
FIG. 2 is a view of the resulting inverter arm in axial section.
Figure 5:
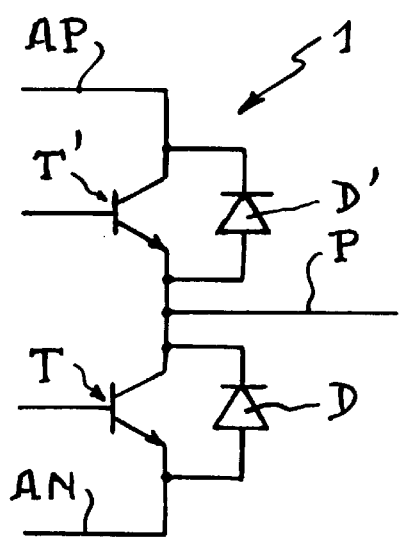
FIG. 5 is a circuit diagram of the inverter arm shown in the previous figures.

FIG. 5 is an electronic circuit diagram of the inverter arm 1. Comparing it with FIGS. 1 and 2 in particular, it is clear that the substrate 2 forms a negative supply rail AN and that the additional busbar 34 forms a positive supply rail AP.

The set of diodes 4 and the set of diodes 104 constitute the respective equivalent diodes D and D' in FIG. 5.

Similarly, the IGBT 6 and IGBT 106 constitute the respective equivalent transistors T and T' in FIG. 5. Finally, the intermediary conductive busbar 20 forms the phase line P of the inverter 1.

The inverter arm when assembled by the process as described above can be cooled by immersing it in a dielectric fluid. The substrate 2 and the busbars 18 and 34, which are all electrically conductive, then additionally assume a heat dissipation function.

It is equally feasible to include the substrate 2 and the busbar 34 in two composite heat transfer and electrical insulation structures. To this end, an insulative layer 42 and a conductive layer 44 may be placed under the substrate 2, as shown in chain-dotted outline for both of them, so that the substrate 2 constitutes the top layer of the resulting structure 46. Similarly, it is possible to mount respective insulative and conductive layers 48 and 50 on top of the conductive busbar 34 so that the busbar 34 constitutes the bottom layer of the resulting composite structure 52.

The inverter arm 1 is then cooled by bringing the conductive end layers 44, 50 of the composite structures 46, 52 into contact with cooling members, not shown. These can be water-cooled plates, air heat exchangers or "caloduc" evaporator nozzles, in the conventional way. The inverter arm in accordance with the invention is therefore cooled from both its top and bottom faces.

The invention achieves the objects previously stated. The three-dimensional structure of the electronic power device in accordance with the invention makes it remarkably compact. Compared to power devices well-known in the art, the invention significantly reduces the final overall volume of the device and also reduces spurious inductance phenomena.

Also, the invention makes it possible to dispense with the aluminum wires used in the prior art. Apart from simplifying manufacture, this improves reliability in that the aluminum wires can be the cause of serious malfunctions, being subjected in service to thermal cycling which can cause them to rupture.

Furthermore, in the absence of such aluminum wires, the power device in accordance with the invention is easier to cool than prior art devices. The aluminum wires constitute a limiting factor with regard to cooling, because they are heated in proportion to the square of the current flowing through them, and it is difficult to cool them. The heat dissipation guaranteed by the substrate and the conductive busbars is proposed in this respect.

Because of the improved cooling, the invention either increases the current capacity of the power device for a given quantity of semiconductor material used, and therefore a given unit cost, or reduces the volume, and therefore the overall unit cost, for a given nominal current.

The improved cooling is particularly beneficial if the conductive substrate and the conductive busbar opposite it are both part of a composite heat transfer and electrical insulation structure. This simultaneously cools the set of semiconductor circuits constituting the power device from both their top and bottom faces.

What is claimed is:

1. A power electronic device comprising a conductive substrate on which rests a first plane arrangement of semiconductor circuits formed by diodes and insulated gate bipolar transistors, said semiconductor circuits having connecting terminals, wherein said device comprises at least one second plane arrangement of semiconductor circuits, two adjacent plane arrangements being separated by a plane conductor array comprising at least one electrically conductive and heat dissipative busbar connected to terminals of circuits of a first arrangement, said busbar further supporting, on its face opposite the substrate, circuits of a second plane arrangement, at least one conductive member electrically insulated from said busbar being connected to other terminals of the circuits of said first arrangement and being disposed within the volume of said busbar.

2. A device according to claim 1, wherein an end plane arrangement of semiconductor circuits is covered by an end plane conductor array which comprises at least one electrically conductive and thermally dissipative end busbar connecting terminals of the circuits of said end arrangement and at least one end conductor member electrically insulated from said end busbar which is connected to other terminals of circuits of said end arrangement and is within the volume of the busbar.

3. A device according to claim 1, wherein the terminals of said plane arrangements are fixed to the respective plane arrays by soldering at least one tin-lead-silver boss.

4. A device according to claim 3, wherein said terminals are separated from the or each boss by a coating adhering to the or each boss, in particular a titanium-nickel-gold deposit.

5. A device according to claim 1, wherein said at least one conductive busbar has at least one shoulder and thereby extends globally in a plane parallel to that of said substrate.

6. A device according to claim 2, wherein said substrate and said end busbar are parts of respective thermal transfer and electrical insulation composite structures.

7. A device according to claim 1, wherein said conductive busbar has notches receiving said conductive members.

8. A device according to claim 2, forming an inverter arm and comprising identical first and second plane arrangements and first and second plane conductor arrays.

9. A device according to claim 8, wherein each of said plane arrays comprises at least one gate common to a row of insulated gate bipolar transistors in series.

10. A device according to claim 8, wherein said conductive busbars of said first plane array and said second plane array form emitters common to the insulated gate bipolar transistors of said first plane arrangement and said second plane arrangement respectively.

* * * * *